United States Patent

Henkel

[19]

[11] Patent Number: 6,055,644
[45] Date of Patent: Apr. 25, 2000

[54] MULTI-CHANNEL ARCHITECTURE WITH CHANNEL INDEPENDENT CLOCK SIGNALS

[75] Inventor: Thomas Henkel, Boeblingen, Germany

[73] Assignee: Hewlett-Packard Company, Palo Alto, Calif.

[21] Appl. No.: 09/050,289

[22] Filed: Mar. 30, 1998

[30] Foreign Application Priority Data

May 30, 1997 [EP] European Pat. Off. .............. 97108691
Aug. 28, 1997 [EP] European Pat. Off. .............. 97114914

[51] Int. Cl.[7] ...................................................... G06F 1/04
[52] U.S. Cl. ............................................................ 713/500
[58] Field of Search .................................... 713/500, 501; 714/723, 731, 744; 395/500.05, 500.06

[56] References Cited

U.S. PATENT DOCUMENTS 4,788,492  11/1988  Schubert ................................. 714/724
5,377,206  12/1994  Smith ...................................... 714/797
5,654,657   8/1997  Pearce ..................................... 327/163

Primary Examiner—Thomas M. Heckler

[57] ABSTRACT

Described is a multi-channel architecture comprising a central master clock generator for generating a central master clock signal and a plurality of channels connectable with inputs or outputs of a device. The multi-channel architecture further includes a channel master clock gate assigned to a respective channel of the plurality of channels, for receiving the central master clock signal and for generating a channel clock signal from the central master clock signal. The multi-channel architecture can be used in a tester arrangement, and preferably in an IC tester. The described multi-channel architecture allows clock signals to be provided for each one of the channels independent of other channels, e.g. to apply a continuous clock signal in one channel while the clock signal in other channels might be changed, e.g. in order to receive new timing edges as references for testing a DUT.

8 Claims, 10 Drawing Sheets

MULTI-CHANNEL ARCHITECTURE WITH CHANNEL INDEPENDENT CLOCK SIGNALS

BACKGROUND OF THE INVENTION

The present invention generally relates to the generation of clock signals in a multi-channel architecture, such as a tester circuit, according to the preamble of the independent claims.

A multi-channel architecture generally comprises a main computer system and a plurality of individual channels. The multi-channel architecture distinguishes from other computer architectures in that the multi-channel architecture allows a functioning of each one of the plurality of individual channels independent of the other channels.

An important application of the multi-channel architecture is in testing applications for testing e.g. integrated circuits (IC's) or other electronic devices, such as the Hewlett-Packard HP 83000 Digital IC Test Systems. A typical testing unit comprises a tester circuit and a device under test (DUT), which can be an IC or any other electronic device. The tester circuit generally comprises a signal generating unit for generating and applying a stream of stimulus data (also called vector data) to the DUT, a signal receiving unit for receiving a response on the stream of stimulus data from the DUT, and a signal analyzing unit for comparing the response with an expected data stream. The tester circuit can thus draw conclusions about the properties and quality of the DUT.

In certain multi-channel architecture systems, data and signals are applied, received, provided, driven, or processed in any way in a so called period driven approach. This means that data is driven or sampled during a specific clock cycle defined as the period of time between successive rising edges of a periodic clock signal. The exact position in time within such a clock cycle, for example the moment when a certain action is to be started, is determined by a so-called edge delay which is referenced to the start of the respective clock cycle and associated to the drive or sample actions by the vectors. In particular, the period driven approach may be applied in tester systems for applying the stimulus data to the DUT and capturing the response. This means that data is driven or sampled during a clock cycle of the DUT.

In a tester multi-channel architecture such as a tester per pin architecture, each one of a plurality of signal pins of the DUT is usually connected to one channel of the tester circuit. Each channel contains a complete test processor comprising all necessary components for generating the stimulus data and/or expected data streams including edge delay generators that provide time marks at defined positions within a respective clock cycle.

FIG. 1 shows an example of a tester per pin architecture as known in the art, as an example for a multi-channel architecture applying the period driven approach. A tester 10 contains a central master clock generator 40 feeding a master clock signal 200 into a master clock gate 50. The master clock gate 50 is controlled by a change timing circuit 60 through a clock enable signal 220. An output of the master clock gate 50, a gated master clock 210, is distributed to a plurality of tester channels 20aa . . . 20zz along with the clock enable signal 220. The tester channels 20aa . . . 20zz are respectively connected to an individual pin of a DUT 70 through respective pin lines 300aa . . . 300zz. The tester channels 20aa . . . 20zz contain respective timing generators 30aa . . . 30zz, which are usually built up of an arbitrary number of edge delay generators using the gated master clock 210 for a generation of an edge.

Each respective clock cycle and each respective edge position used for testing the DUT 70 is derived from the centrally generated master clock 200 of a frequency that normally is an even multiple of the clock frequency of the DUT 70.

Each one of the timing generators 30aa . . . 30zz for generating edge delays use a first rising edge of the gated master clock 210 as a reference. The first edge is generated, usually after a programmable amount of clock cycles of the master clock 200 and an also programmable analog delay after that first master clock cycle, by gating the master clock 200 by means of the master clock gate 50, thus receiving the first rising edge of the gated master clock 210. The generation of an edge may then be repeated after a programmable amount of cycles of the master clock 200.

Once the generated edge delays are established, their relationship stays fixed as long as the master clock 200 is active. For some types of DUT 70 it is necessary, however, to reprogram the timing generators 30aa . . . 30zz during an execution of a test to change the position of the drive and sampling actions in the clock cycle.

In order to perform the reprogramming of the edge positions, the timing generators 30aa . . . 30zz output a ready-for-change signal 230 that is accumulated from all tester channels 20aa . . . 20zz, e.g. by using a WIRED-AND connection. The ready-for-change signal 230 is sent to the change timing circuit 60 requesting the gated master clock 210 to be stopped, so that the timing generators 30aa . . . 30zz can be reprogrammed. The change timing circuit 60 deactivates the clock enable signal 220 which stops the gated master clock 210 through the central master clock gate 50 and also instructs the timing generators 30a . . . 30zz to accept their new programming values and deactivate the ready-for-change signal 230. This, in turn, causes the change timing circuit 60 to restart the gated master clock 210 through the clock enable signal 220. In that way, a new first rising edge of the gated master clock 210 is generated as a new reference for the timing generators 30aa . . . 30zz.

The architecture of FIG. 1 has certain advantages such as an unmatched speed and accuracy. However, disadvantageous is that during the reprogramming of the timing generators 30aa . . . 30zz the gated master clock 210 needs to be turned off. This interrupts the stimulus data stream on all pin lines 300aa . . . 300zz of the DUT 70. DUTs 70 which e.g. use phase locked loop (PLL) circuits to generate an internal clock from an external reference clock will have to wait for a PLL lock after such an interruption. This severely limits the efficiency and throughput of the tester 10 and thus leads to an increase of the testing. expenditure.

A further problem occurs in the architecture of FIG. 1 when more than one DUT 70 is to be tested at the same time (a so called multi-site test). In order to save costs and to make optimal use of the tester 10, as many devices as possible should be tested in parallel. In an architecture allowing parallel testing, central resources of the tester 10 such as cabinets, computer, manipulator and controller are required only once.

The multi-site test challenges the traditional tester per pin architecture, because the devices to be tested can behave differently, due to production variance in speed or functional defects. Therefore, the need arises to follow different paths in the test execution flow for the differing DUTs. The test execution for a plurality of different DUTs should preferably be executed in parallel, so that the throughput advantage of multi-site testing is not lost to the need to execute different paths one at time. This ability involves edge delay reprogramming for one DUT while the other DUTs perform different operations at the same time. However, as soon as the gated master clock 210 is turned off by the change timing circuit 60 due to reprogramming, the other DUTs can not continue to operate undisturbed.

SUMMARY OF THE INVENTION

It is an object of the invention to provide an improved clock arrangement for a multi-channel architecture. The object is solved by the features of the independent claims.

According to a first aspect of the invention, a multi-channel architecture comprises a central master clock generator for generating a central master clock signal and a plurality of channels connectable with inputs or outputs of a device. The multi-channel architecture further comprises a channel master clock means assigned to a respective channel of the plurality of channels, for receiving the central master clock signal and for generating a channel clock signal from the central master clock signal.

The multi-channel architecture according to the invention allows to provide clock signals for each one of the channels independent of other channels, e.g. to apply a continuous clock signal in one channel while the clock signal in other channels might be changed, e.g. in order to receive new timing edges as references for testing a DUT.

The generation of the channel clock signal in the respective channel is preferably accomplished by providing respective channel selecting means for individually generating the channel clock signal independently of other tester channels. The channel selecting means are preferably centrally controlled within the tester.

According to a second aspect of the invention, the invention further allows to implement a multi-site architecture, e.g. for testing one or more different DUTs simultaneously and in parallel. This is accomplished by providing a site signal for modifying the channel clock of the respective channel according to a predefined setting for the respective site and a channel signal for modifying the channel clock of the respective channel according to a predefined setting for the respective channel. Further more, applied is a controlling means, coupled to the channel master clock means and receiving the site selection signal and the channel selection signal, for controlling the generating of the channel clock by means of the site selection signal and the channel selection signal.

In the multi-channel architecture, the channel master clock means preferably comprises means for generating a reference signal from the central master clock signal for the respective channel.

The multi-channel architecture can be used in a tester arrangement, and preferably in an IC tester.

BRIEF DESCRIPTION OF THE DRAWINGS

Other objects and many of the attendant advantages of the present invention will be readily appreciated and become better understood by reference to the following detailed description when considering in connection with the accompanied drawings, in which.

DETAILED DESCRIPTION OF THE INVENTION

The invention will be explained the following in details for the example of a tester architecture. However, it is clear that the invention is not limited to tester architectures, but can be applied to any multi-channel architecture.

Figure 2A:
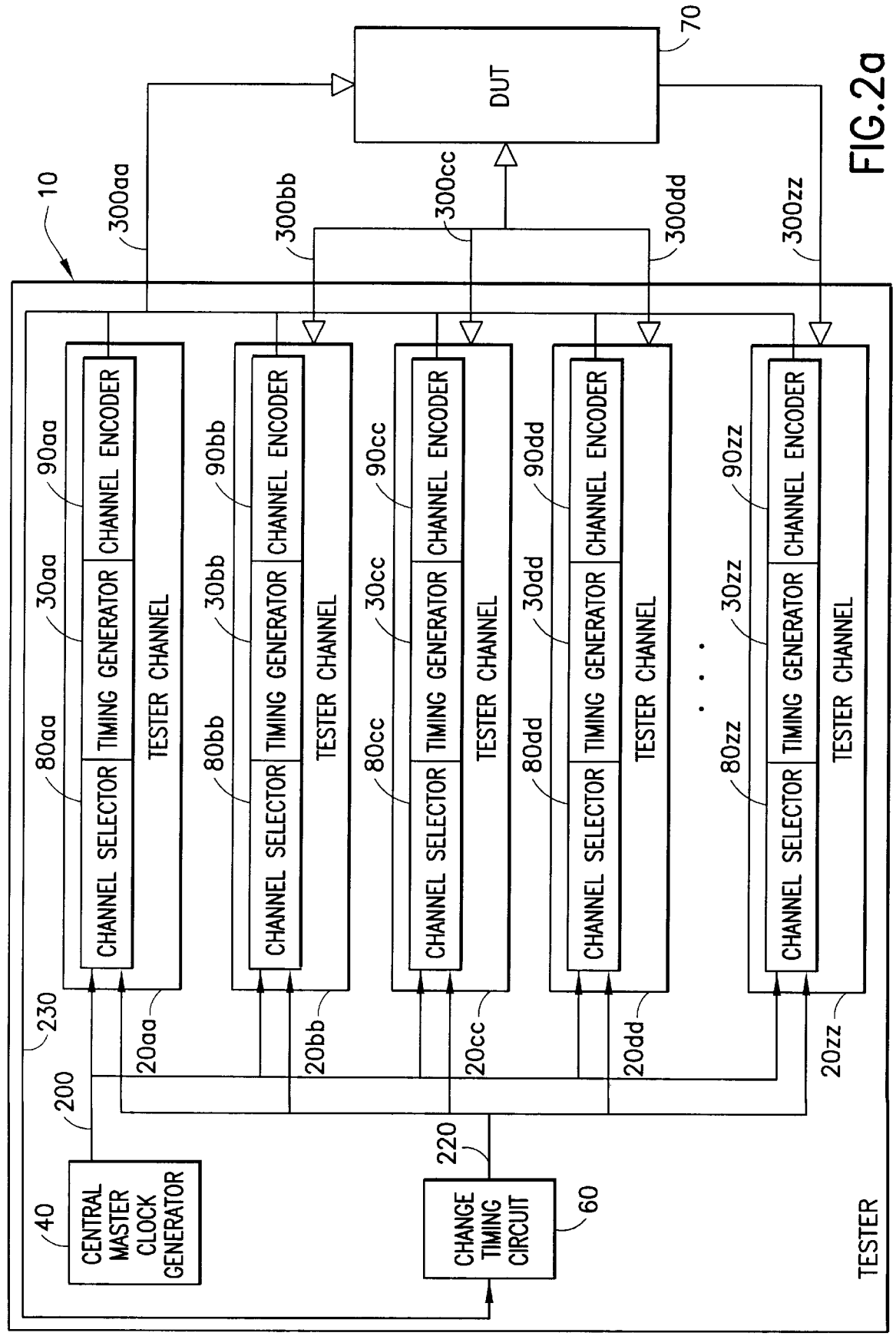
FIGS. 2a and 2b show a first embodiment of a tester architecture according to the invention supporting a continuous clock.
Figure 2B:
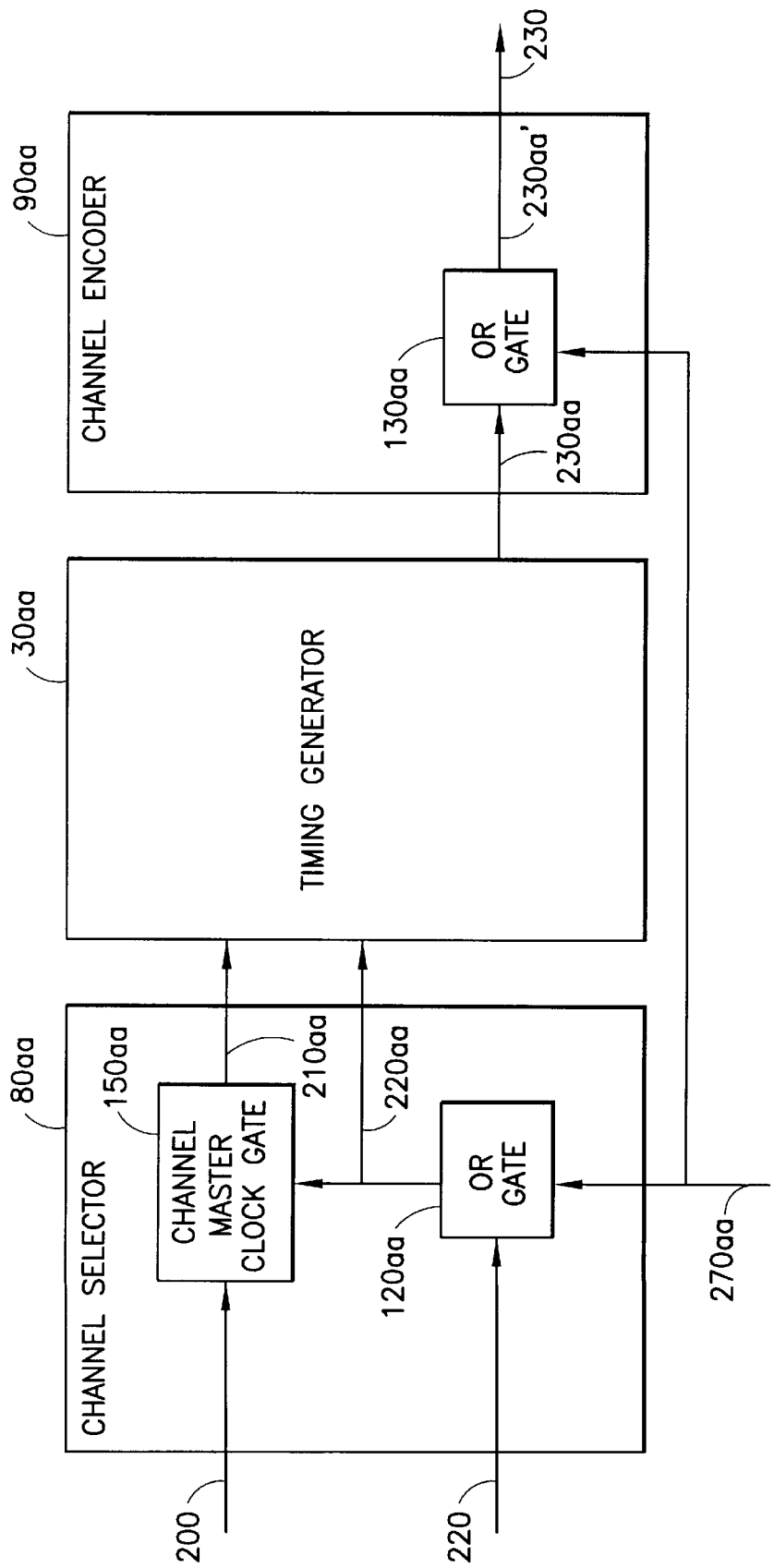

FIGS. 2a and 2b show an example of a first embodiment of a tester architecture according to the invention supporting a continuous clock for each one of the plurality of the tester channels 20aa . . . 20zz. The tester 10 comprises the central master clock generator 40 for generating the master clock signal 200. According to the invention, the master clock 200 is distributed ungated to at least one of the plurality of the tester channels 20aa . . . 20zz, and preferably to each one of the plurality of the tester channels 20aa . . . 20zz. In the description hereafter for the sake of simplicity, the decentralized gating of the master clock 200 is shown for any one of the tester channels 20aa . . . 20zz. However, it is clear that the decentralized gating of the master clock 200 can also be executed in only a few ones of the tester channels 20aa . . . 20zz.

FIG. 2b depicts the internal structure responsible for the supporting of a continuous clock within the tester channel 20aa as an example for the plurality of the tester channels 20aa . . . 20zz. It is to be understood that each element referred to with an 'aa' put after the respective reference sign is an element individual in the respective tester channel 20aa and appears correspondingly (with a 'bb' . . . 'zz' put after the respective reference sign) in each other one of the tester channels 20bb . . . 20zz.

The tester channel 20aa comprises a respective channel selector 80aa, a respective timing generator 30aa, and a respective channel encoder 90aa. The channel selector 80aa receives the master clock signal 200 and the clock enable signal 220. The clock enable signal 220 is qualified, e.g. by an (OR) gate 120aa that holds a qualified clock enable signal 220aa true as long as a channel continuous clock select setting 270aa is activated. The thus qualified channel qualified clock enable 220aa controls a channel master clock gate 150aa, which can be substantially controlled in the same way as the central master clock gate 50 is controlled in the architecture of FIG. 1. The channel master clock gate 150aa and the central master clock gate 50 can be functionally identical. The channel master clock gate 150aa outputs a gated channel master clock 210aa to the timing generator 30aa.

Figure 1:
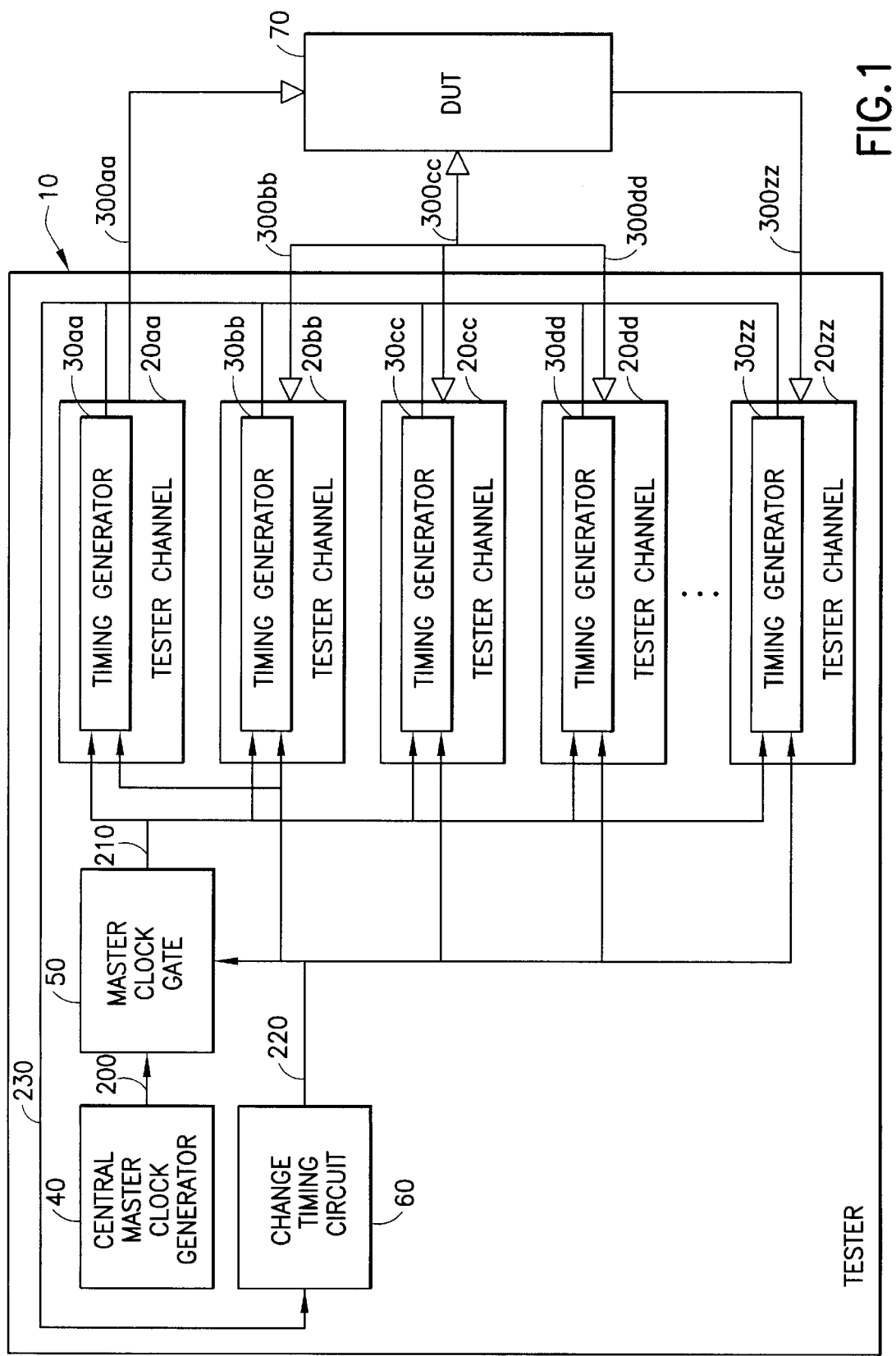
FIG. 1 shows a tester per pin architecture as known in the art.

The channel master clock gate 150aa drives the timing generator 30aa, which might be functionally identical with the timing generators 30aa . . . 30zz of FIG. 1 and is also controlled by the qualified channel clock enable 220aa substantially in the same way as in the architecture of FIG. 1. The timing generator 30aa outputs a channel ready-for-change signal 230aa to the channel encoder 90aa.

In the channel encoder 90aa, the channel ready-for-change signal 230aa is qualified, e.g. by another (OR) gate 130aa that holds a qualified channel ready-for-change signal 230aa" true as long as the channel continuous clock select setting 270aa is activated. The qualified channel ready-for-change signal 230aa" is then added to the ready-for-change signal 230 that is accumulated from all tester channels 20aa . . . 20zz e.g. by using a WIRED-AND connection.

When the tester 10 is started or in case that a reprogramming of the edge positions is requested, each individual tester channel 20ii (whereby ii can be any one of the references aa . . . zz) of the plurality of tester channels 20aa . . . 20zz, wherein a new first rising edge of the gated channel master clock 210ii is to be generated, emits a respective ready-for-change signal 230ii" to the accumulated ready-for-change signal 230. The accumulated ready-for-change signal 230 is sent to the change timing circuit 60, which again sends the clock enable signal 220 to the plurality of tester channels 20aa . . . zz. In each individual tester channel 20ii of the plurality of tester channels 20aa . . . 20zz wherein the respective channel continuous clock select setting 270ii is deactivated, the central master clock 200 is gated by the respective channel master clock gate 150ii to the respective gated channel master clock 210ii. The gated channel master clock 210ii is then applied to the respective timing generator 30ii and the timing generator 30ii eventually removes the channel ready-for-change signal 230ii. This, in turn, causes the change timing circuit 60 to restart the gated channel master clock 210ii by means of the clock enable signal 220 in combination with the respective channel continuous clock select setting 270ii. In that way, a new first rising edge of the gated channel master clock 210ii is generated as a new reference for the timing generators 30ii.

In each individual tester channel 20ii, the gating of the master clock 200, and therefore the generation of a new first rising edge of the gated channel master clock 210ii, can thus be controlled by the respective channel continuous clock select setting 270ii, allowing to control whether the clock signal within the respective channel 20ii is applied continuously or gated by means of the respective channel master clock gate 150ii. The respective setting of the channel continuous clock select setting 270ii for each one of the plurality of tester channels 20aa . . . 20zz can be controlled by suitable circuits (not shown in the figures) as known in the art.

At the start of the tester 10, each channel continuous clock select setting 270ii is preferably activated in order to simultaneously achieve a first rising edge of the gated channel master clock 210ii in each one of the plurality of tester channels 20aa . . . 20zz.

The embodiment of FIGS. 2a and 2b allows to maintain the master clock 200 (and accordingly the channel master clock 210ii) continuously or to reprogram the edge position independently in each one of the plurality of tester channels 20aa . . . 20zz by means of the respective setting for each channel continuous clock select setting 270ii. In case that e.g. PLLs are used in certain channels, the clock signal within those channels can be maintained continuously, thus keeping the PLL locked during a change timing sequence on other pins.

Figure 3A:
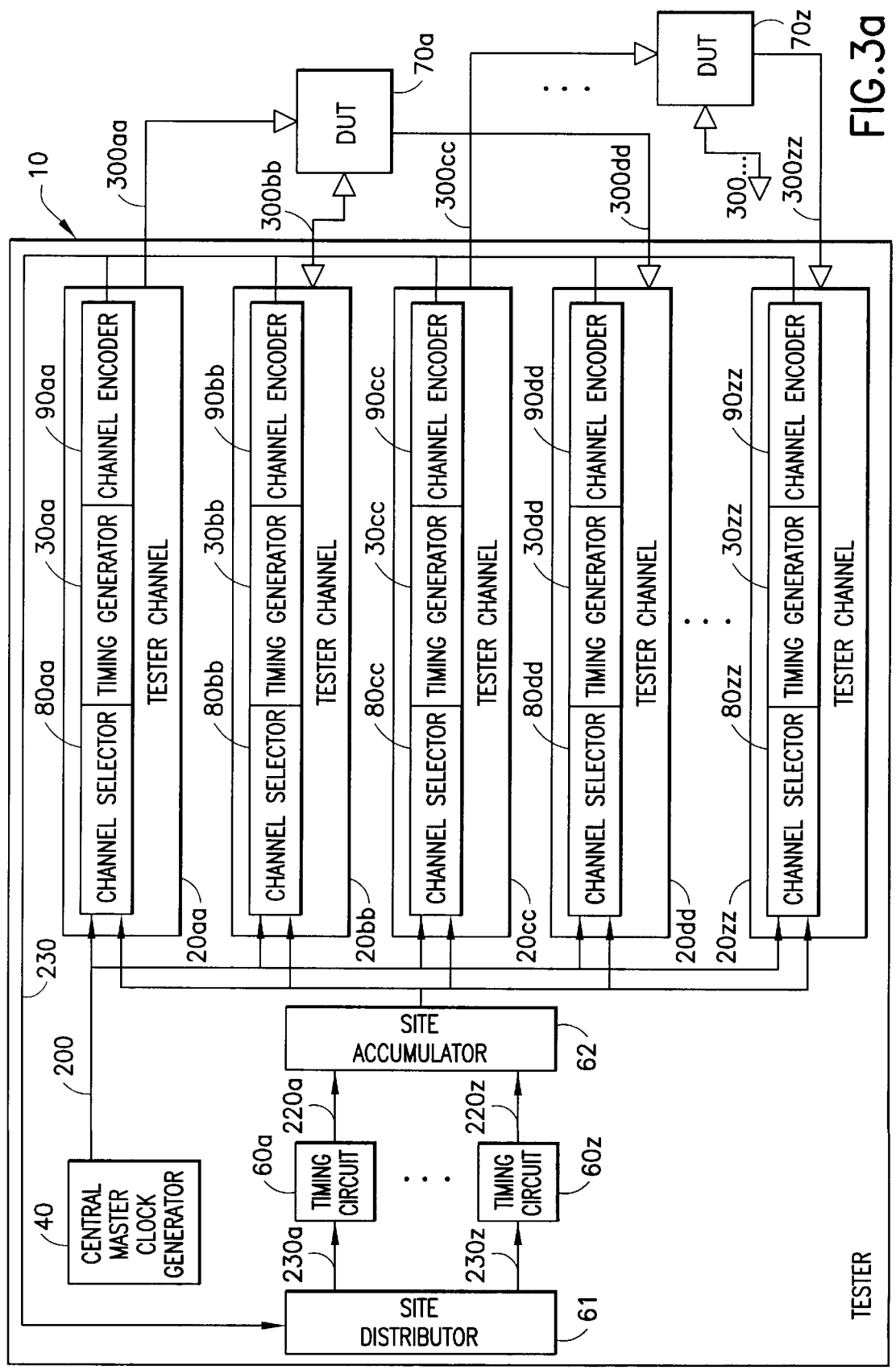
FIGS. 3a and 3b show a second embodiment of a tester architecture according to the invention further allowing a multi-site application.
Figure 3B:
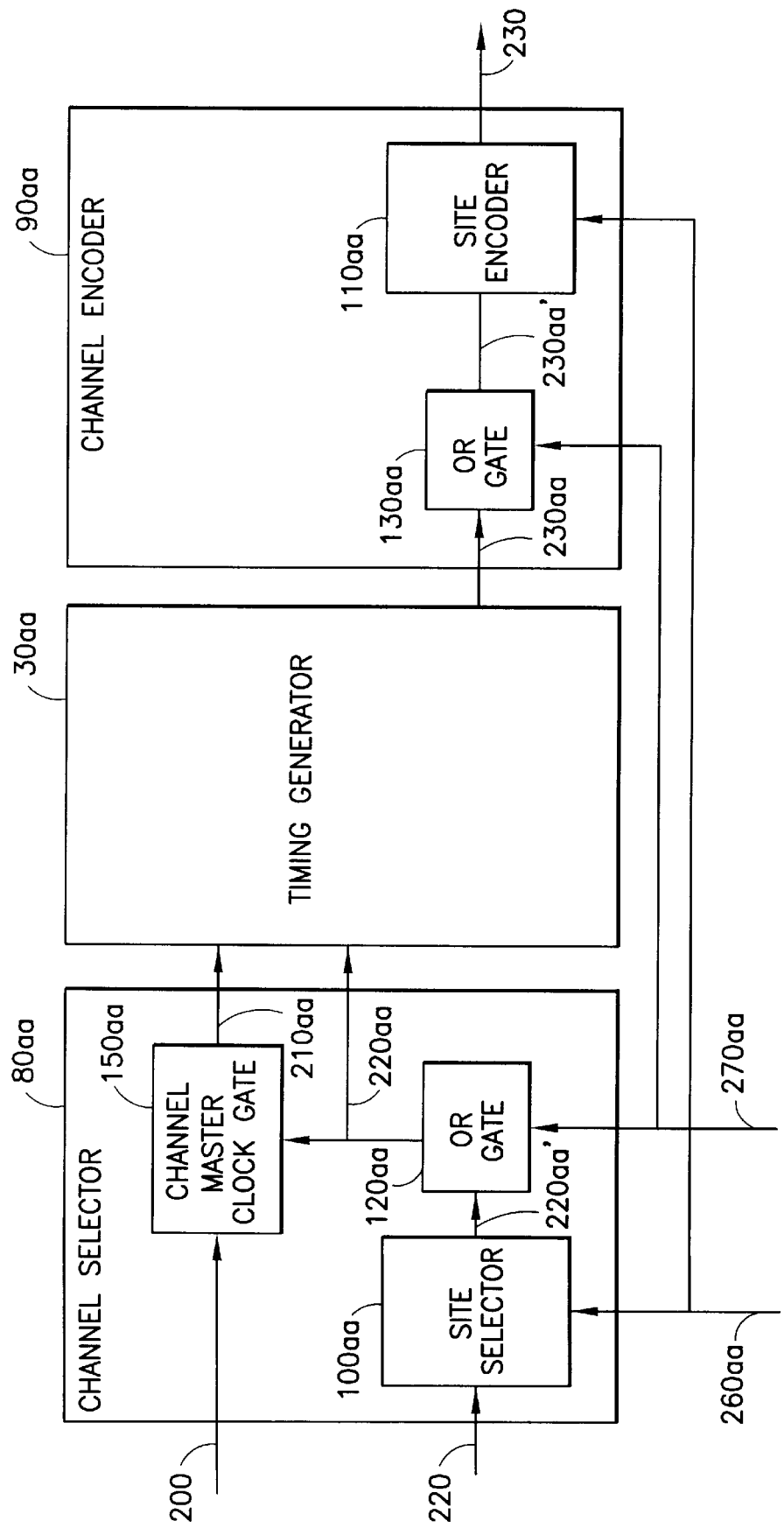

FIGS. 3a and 3b show a second embodiment of a tester architecture according to the invention further allowing a multi-site application of the tester 10. The tester channels 20aa . . . 20zz are connected to one or more individual DUTs 70a . . . 70z through respective ones of the pin lines 300aa . . . 300zz. The one or more individual DUTs 70a . . . 70z can be tested independently and in parallel as indicated in FIG. 3a, wherein e.g. IDUT 70a receives pin lines 300aa and 300bb and outputs pin lines 300bb and 300dd, and DUT 70z receives pin line 300cc and outputs pin line 300zz.

An individual site i of the tester 10 is defined and determined by respective ones of the tester channels 20aa . . . 20zz connected via respective ones of the pin lines 300aa . . . 300zz with one of the one or more individual DUTs 70a . . . 70z. Multi-site application accordingly means that the tester 10 can support one or more individual sites. However, it is to be understood, that as well the number of pin lines connected to one DUT as the number of DUTs is only limited by the total number of pin lines 300aa . . . 300zz. Further more, the DUTs 70a . . . 70z can be arranged to the respective pin lines 300aa . . . 300zz in any order.

The multi-site architecture of FIG. 3a shows a plurality of change timing circuits 60a . . . 60z, whereby one change timing circuit 60i (whereby i can be any one of the references a . . . z) is assigned to one DUT 70i of the one or more individual DUTs 70a . . . 70z. The plurality of change timing circuits 60a . . . 60z might be substantially identical with the change timing circuit 60. Each change timing circuit 60i provides a respective site clock enable signal 220i to a site accumulator 62 accumulating a plurality of received site clock enable signals 220a . . . 220z to an accumulated clock enable signal 220, herein referenced as a clock enable bus 220. The clock enable bus 220 is connected to the respective channel selectors 80aa . . . 80zz within each one of the tester channels 20aa . . . 20zz.

FIG. 3b depicts the internal structure responsible for the supporting of a continuous clock in a multi-site application within the tester channel 20aa, as an example for the plurality of the tester channels 20aa . . . 20zz. The channel selector 80aa extracts the corresponding site clock enable signal 220i from the plurality of site clock enable signals 220a . . . 220z received from the clock enable bus 220, according to a site select setting 260aa using a site selector 100aa which can be a multiplexer 100aa. A thus received channel clock enable signal 220aa" is then qualified, e.g. by the (OR) gate 120aa that holds the qualified channel clock enable signal 220aa true while the channel continuous clock select setting 270aa is activated. The qualified site clock enable 220aa controls the channel master clock gate 150aa which outputs the gated channel master clock 210aa.

In the site encoder 90aa, the channel ready-for-change signal 230aa is qualified, e.g. by the (OR) gate 130aa that holds the qualified channel ready-for-change signal 230aa" true while the channel continuous clock select setting 270aa is activated. This signal is then output to the proper location on a ready-for-change bus 230 according to the site select settings 260aa using a site encoder 110aa which can be a demultiplexer 110aa.

The ready-for-change bus 230 accumulates the qualified channel ready-for-change signals 230aa" . . . 230zz" of each one of the channel encoders 90aa . . . 90zz of the channels 20aa . . . 20zz, e.g. by using a WIRED-AND connection, to the corresponding one of the site clock enable signals 220a . . . 220z. A site distributor 61 selects for each change timing circuit 60i of the plurality of change timing circuits 60a . . . 60z a thereto corresponding site ready-for-change signal 230i from a plurality of site ready-for-change signals 230a . . . 230z.

The assignment of the respective tester channels 20aa . . . 20zz to one respective site i (and therefore to one respective DUTi) can be fixed in a way that a certain number of tester channels 20aa . . . 20zz is assigned to one site i. However, in a preferred embodiment, the number of tester channels 20aa . . . 20zz assigned to one site i is controlled and determined by means of the respective site select setting 260ii in each tester channels 20ii. The respective setting of the site select setting 260ii for each site i and each one of the plurality of tester channels 20aa . . . 20zz can be controlled by suitable circuits (not shown in the figures) as known in the art.

The respective tester channels 20aa . . . 20zz assigned to one respective site i can activate the according site ready-for-change signal 230i on the ready-to-change bus 230 through their site encoders 90aa . . . zz. The site distributor 61 forwards the site ready-for-change signal 230i to the respective one of the plurality of change timing circuits 60a . . . 60z through the respective one of the site ready-for-change signals 230a . . . z which, in turn, disables the respective ones of the channel master clocks 210aa . . . zz through the respective ones of the plurality of site clock enable signals 220a . . . 220z, the site accumulator 62, the clock enable bus 220, and the respective ones of the channel site selectors 80aa . . . zz. The reprogramming of the tester channels in this site i is performed, the respective ready-for-change signals deactivated and the respective master clock turned back on by the respective one of the plurality of change timing circuits 60a . . . 60z. The tester channels of other sites continue to keep running undisturbed since their individual change timing circuit was not activated.

If continuous clock is selected for one tester channel 20ii by the signal 270ii, it no longer partakes in change timing sequences, because the gated master clock 210ii of the tester channel 20ii can no longer be stopped by the clock enable signal 220ii, which is blocked by the (OR) gate 120ii. For the same reason, the timing generator 30ii is not reprogrammed and due to the (OR) gate 130ii the channel ready-for-change signal 230ii is kept active, so that the tester channel 20ii can not prevent other tester channels of the same site i from performing their change timing sequence. If continuous clock is deselected, the (OR) gates 120ii and 130ii are transparent and therefore have no influence on the behavior.

There are different ways to implement the clock enable signal bus 220 and the ready-for-change bus 230, and the respective functional blocks 61, 62, 100, 110 dealing with them. Several approaches to implement the busses can also be mixed.

Figure 4A:
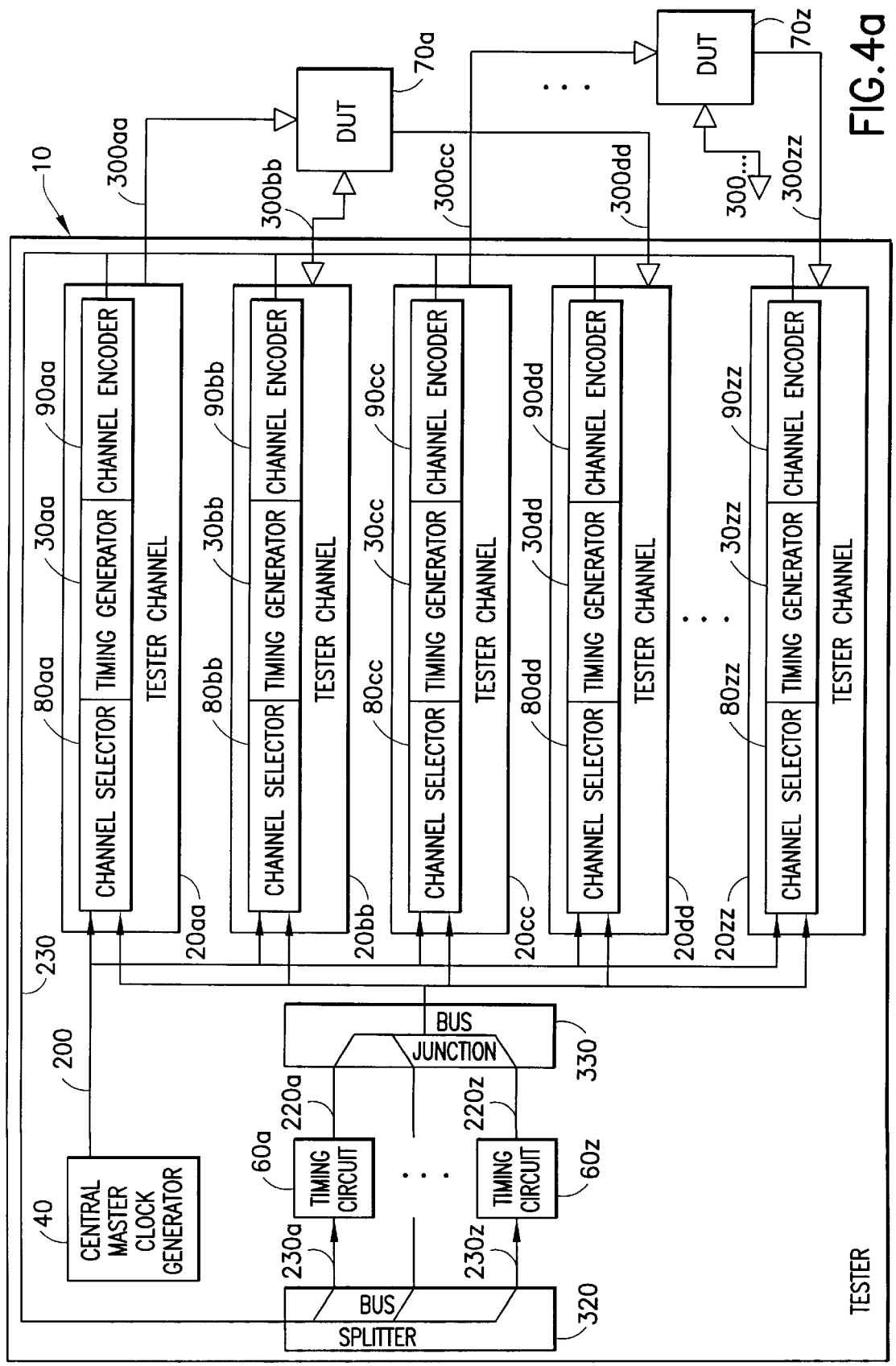
FIGS. 4a and 4b show an implementation of the multi-site tester architecture according to FIGS. 3a and 3b.
Figure 4B:
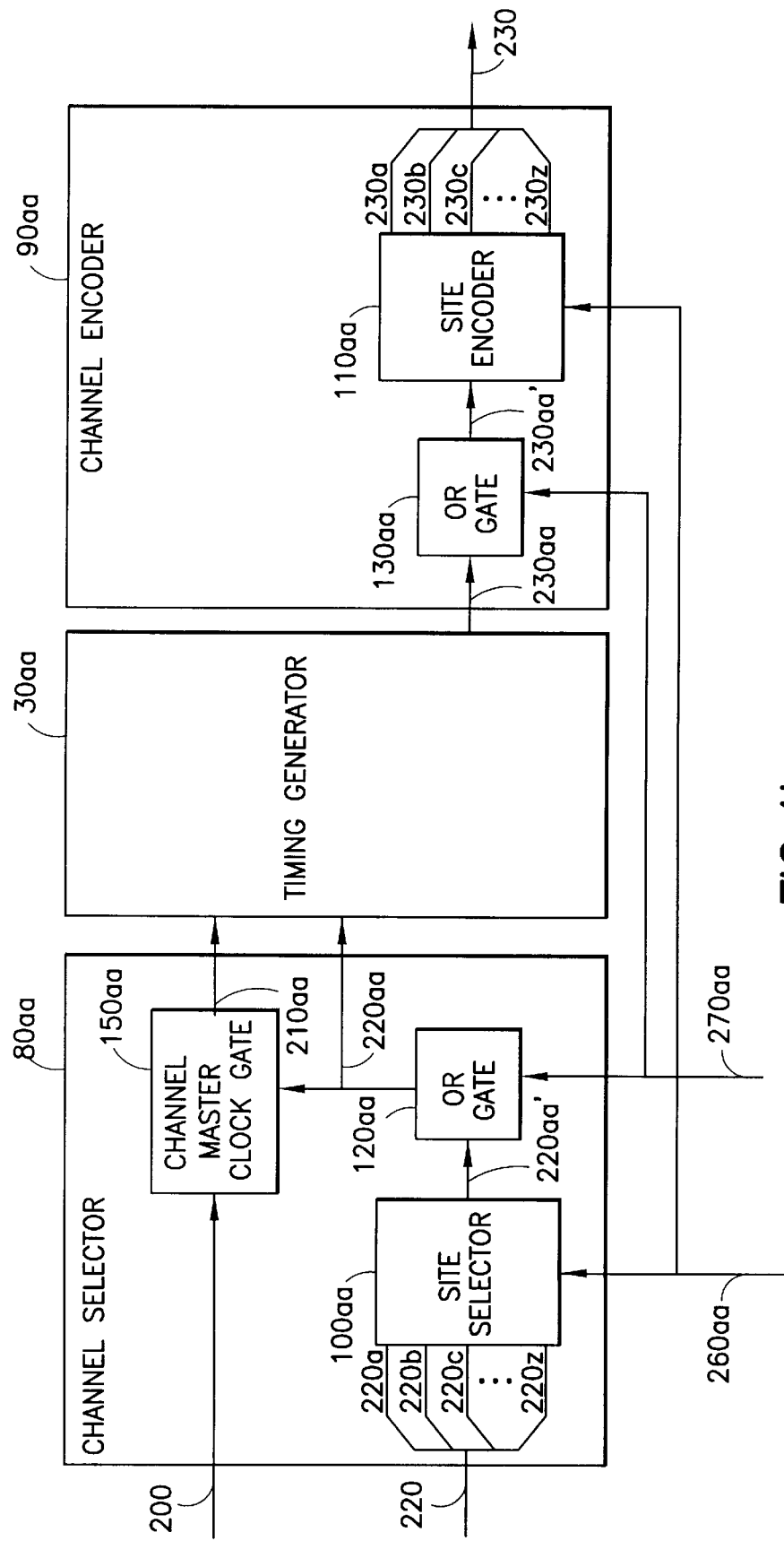

FIGS. 4a and 4b show an embodiment wherein the clock enable signal bus 220 and the ready-for-change bus 230 are made up of actual physical wires with one signal line per site i. The site distributor 61 can then be a bus splitter 320, and the site accumulator 62 may be reduced to a bus junction 330. The site selector 100aa can be a simple n-input multiplexer 100aa and the site encoder 110aa an n-output demultiplexer. This implementation is simple and allows an unaffected change timing execution speed. However, wide busses may be required that need to be routed through the system.

Figure 5A:
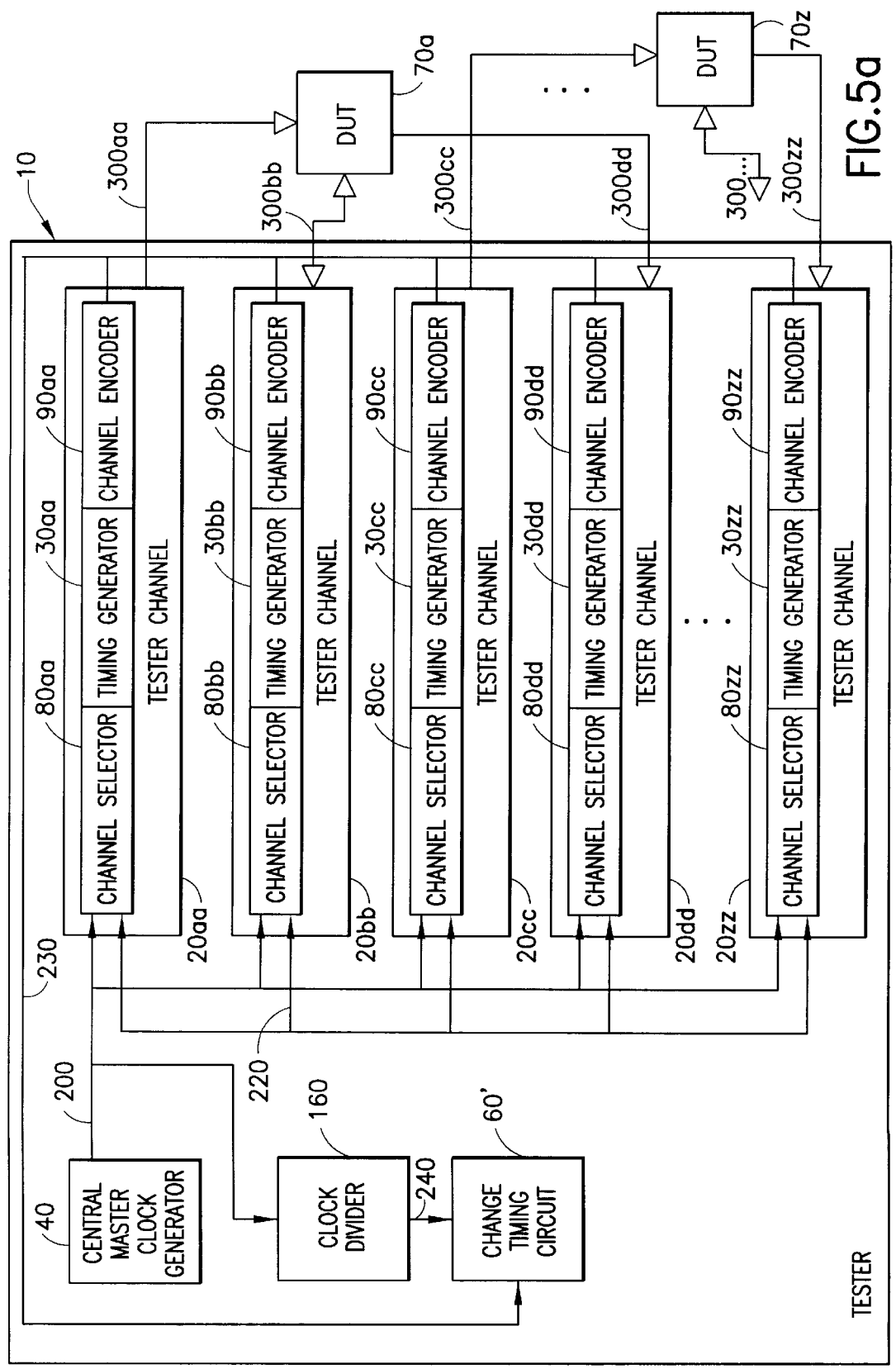
FIG. 5a shows another implementation of the multi-site tester architecture according to FIGS. 3a and 3b using time multiplexing.

FIG. 5a shows another embodiment wherein the change timing per site i is accomplished by time multiplexing on the clock enable signal bus 220 and the ready-for-change bus 230. In that embodiment, the clock enable signal bus 220 and the ready-for-change bus 230 can therefore be single sets of signal lines and are referenced hereafter as clock enable signal 220 and ready-for-change signal 230. The site distributor 61 and the site accumulator 62 are no longer needed and only one change timing circuit 60" is necessary, as it can also be time multiplexed. The site selector 100aa and the site encoder 110aa become more complex, though, because they implement and handle the time multiplexing.

Figure 5B:
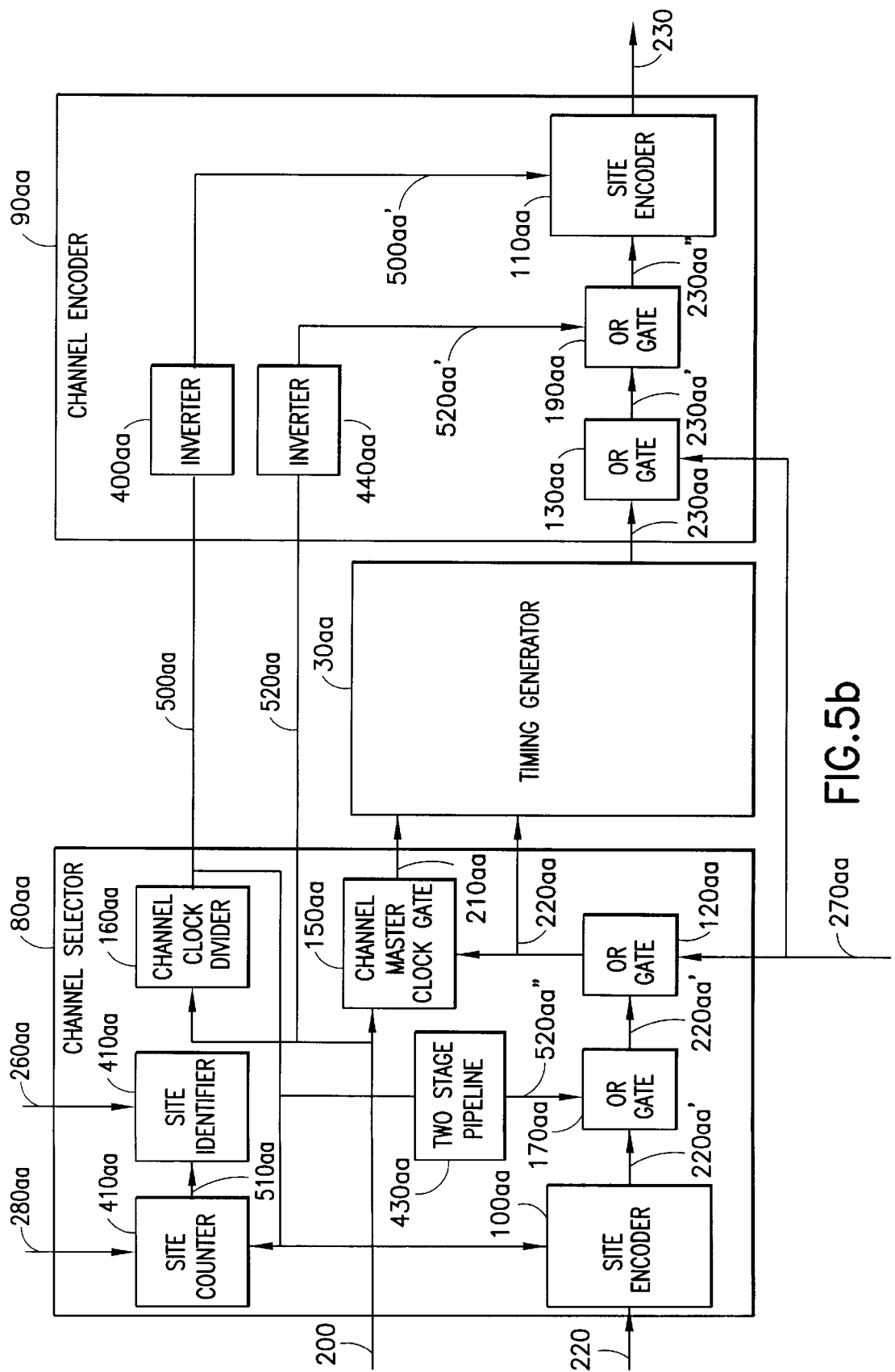
FIG. 5b shows an example of an implementation of the time multiplexing within the multi-site tester architecture according to FIG. 5a, and FIG. 6 shows a timing diagram for the example of FIG. 5b.
Figure 6:
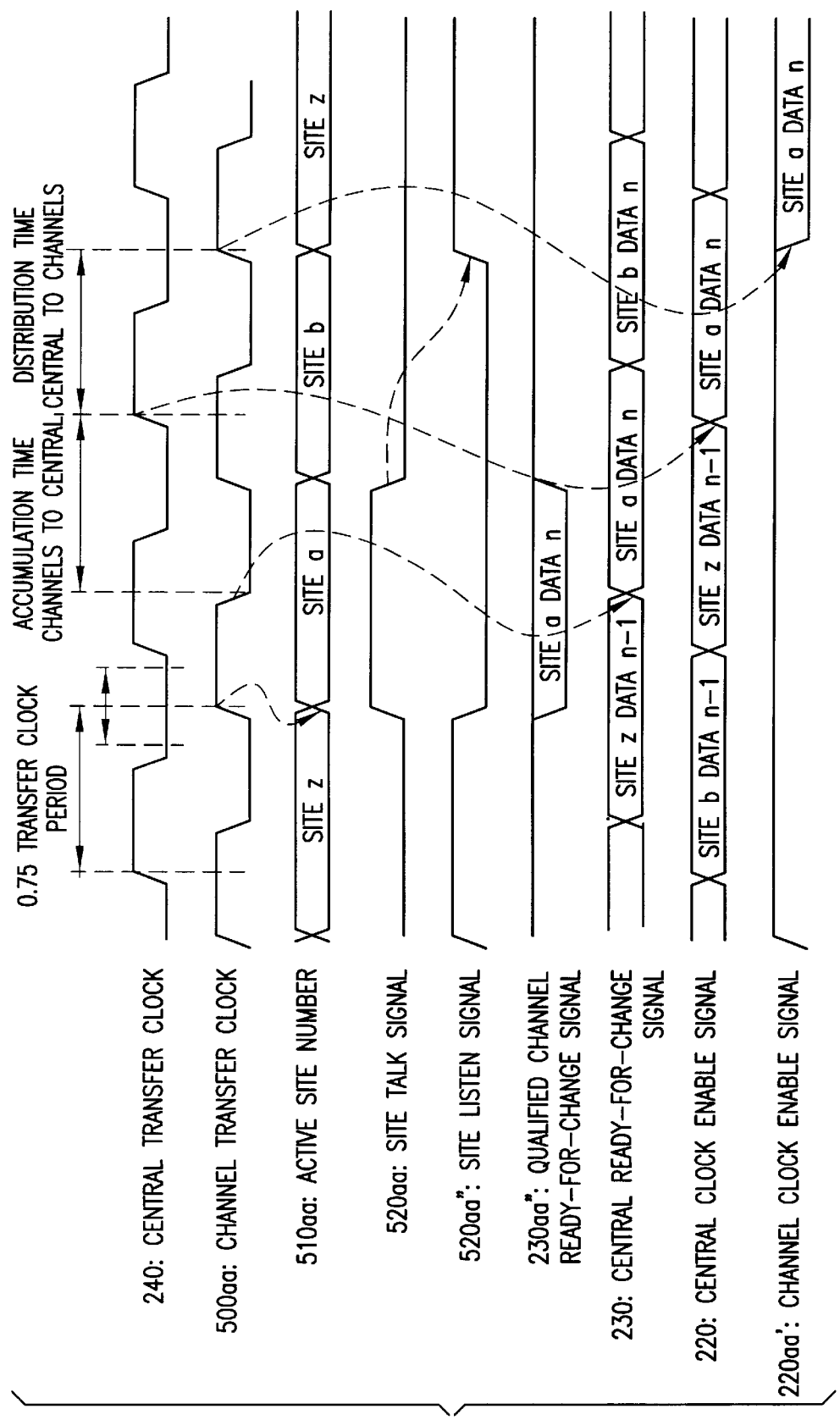

An example for implementing the time multiplexing according to the embodiment of FIG. 5a is given in FIG. 5b. FIG. 6 shows a timing diagram for the example of FIG. 5b. However, it is to be understood that other implementations of the time multiplexing as known in the art can be applied.

In order to establish the time multiplexing to work at all, a clock needs to be generated that allots time slots on the central clock enable signal 220 and the ready-for-change signal 230 for the different sites i. This transfer clock is preferably generated from the (ungated) master clock 200 as well centrally by a clock divider 160 as a central transfer clock 240, as decentralized in each one of the tester channels 20aa . . . 20zz by channel clock dividers 160aa . . . 160zz, as channel transfer clocks 500aa . . . 500zz. The channel clock dividers 160aa . . . 160zz can be functionally identical with the central clock divider 160.

The central transfer clock 240 and the channel transfer clocks 500aa . . . 500zz are generated in a way that they all have the same period, but the channel transfer clocks 500aa . . . 500zz are delayed to the central transfer clock 240 by preferably approximately three quarters of the period. This leads to a data accumulation time from the tester channels 20aa . . . 20zz to the central resources from the falling edge of the channel transfer clocks 500aa . . . 500zz to the rising edge of the central transfer clock 240 of 1.5 periods minus the chosen delay, and a data distribution time from the central resources to the tester channels 20aa . . . 20zz from the rising edge of the central transfer clock 240 to the rising edge of the channel transfer clocks 500aa . . . 500zz of the chosen delay. This way the accumulation and distribution times can be optimally accounted for by choosing the period being greater or equal the sum of the accumulation time and the distribution time divided by 1.5, or in other words: accumulation time+distribution time$\leq 1.5*$ period. Then the delay can be chosen as the distribution time, provided that the delay lies roughly between 55% and 95% of the period (compare also FIG. 6, the relationship between the reference signs 240 and 500aa).

In the change timing circuit 60", the clock-enable signal 220 is updated with every rising edge of the central transfer clock 240, performing the necessary processing for one site i per period of this clock (compare also FIG. 6, reference sign 220).

In tester channel 20aa as an example for any tester channel 20ii of the tester channels 20aa . . . 20zz, the site counter 410aa keeps track of the currently active site i by starting at a first site a and then counting up to the last site z, specified by sites parameter 280ii (sites parameter 280ii in FIG. 5b) programmed into all tester channels 20aa . . . 20zz, with every rising edge of a channel transfer clock 500aa and then starting over with the first site a again. The sites parameters 280aa . . . 280zz are all set to the same value and are the means to determine the number of sites to process. Channel site numbers 260aa . . . 260zz are used to indicate to the tester channels 20aa . . . 20zz to which one of the defined sites i they belong. A site counter 410aa outputs an active site number 510aa which is then compared with the channel site number 260aa by a site identifier 420aa. When the active site number 510aa equals the channel site number 260aa, a site talk signal 520aa is activated for that cycle (cycle shall mean from rising edge to rising edge) of the channel transfer clock 500aa and, delayed by a two stage pipeline 430aa clocked by the channel transfer clock 500aa, a site listen signal 520aa" is activated for the transfer clock cycle two cycles later.

While the site talk 520aa is inactive, a qualified site channel ready-for-change signal 230aa" is kept high through an inverter 440aa and an (OR) gate 190aa, so that the WIRED-AND central ready-for-change signal 230 is not disturbed. When the site talk 520aa is active, however, the qualified channel ready-for-change signal 230aa' can pass through the (OR) gate 190aa and then be output. The qualified channel ready-for-change signal 230aa" is put on the central ready-for-change signal 230 with the falling edge of the channel transfer clock 500aa through the inverter 440aa by the site encoder 110aa, which can be a flip-flop 110aa.

The central clock-enable signal 220 is sampled constantly by the site encoder 100aa with the rising edge of the channel transfer clock 500aa. While site listen signal 520aa" is inactive, the channel clock-enable signal 220aa' is held high through an (OR) gate 170aa, so that data for other sites i on the central clock enable signal 220 do not have an influence on this tester channel 20aa. When the site listen 520aa" is active, however, the sampled channel clock-enable signal 220aa" can pass through the (OR) gate 170aa to control the channel master clock gate 150aa and the timing generator 30aa.

When the tester channel 20aa (as an example for any tester channel 20ii) is ready to change its timing, the timing generator 30aa outputs the channel ready-for-change signal 230aa. Every time that the site talk signal 520aa becomes active, the channel ready-for-change signal 230aa is put on the central ready-for-change signal 230 with the falling edge of the channel transfer clock 500aa, until all channels ii of this site i have activated their respective channel ready-for-change signals 230ii, as well. When this happens, the central ready-for-change signal 230 will be high for this cycle. The change timing circuit 60' will react by deactivating the central clock-enable signal 220 with the next rising edge of the central transfer clock 240 for one cycle. The next rising edge on the channel transfer clock 500aa will sample that and deactivate the channel clock-enable 220aa, as at this time site listen 520aa" is active. This shuts off the channel's gated master clock 210aa for this cycle, instructs the timing generator 30aa to activate the new timing programming, and deactivates the channel ready-for-change signal 230aa. With the next rising edge of the channel transfer clock 500aa, the site listen signal 520aa" becomes inactive reenabling the channel's gated master clock 210aa.

The advantages of this implementation are the narrow interfaces and an almost arbitrary number of sites i.

It is to be understood that the logic as used for implementing the invention is not limited to the logic as given in the examples above. In particular, it is clear that instead of OR gates (e.g. OR gates 120, 130, 190, or 170), AND gates or other logic gates could be used, whereby the respective logic signals and elements have to be adopted accordingly.

I claim:

1. A multi-channel architecture comprising:
   a central master clock generator for generating a central master clock signal;
   a plurality of channels connectable with inputs or outputs of a device; and
   a channel master clock means assigned to a respective channel of the plurality of channels, for receiving the central master clock signal and for generating a channel clock signal from the central master clock signal for said respective channel.

2. The multichannel architecture according to claim 1, wherein the channel master clock means comprises means for generating a reference signal from the central master clock signal for the respective channel.

3. The multi-channel architecture according to claim 1, further comprising:
   a change clock means for generating a change clock signal applied to the plurality of channels to initiate a change of the respective channel clock signal(s); and
   wherein the plurality of channels further comprise a channel selection means for selecting the respective channel to change the respective channel clock signal.

4. The multi-channel architecture according to claim 1, wherein the channel master clock means comprises means for generating a reference signal from the central master clock signal for application to the respective channel.

5. The multi-channel architecture according to claim 4, wherein the site signal has a lower priority than the channel signal.

6. The multi-channel architecture according to claim 4, further comprising:
   at least one change clock means for generating the site signal for each respective site, the respective site signal being applied to the respective channel(s) of that site to initiate a change of the respective channel clock signal (s) in that site; and
   wherein the plurality of channels further comprise:
   a site selection means for selecting the respective site signal for that channel to change the respective channel clock signal(s) in that site, and
   a channel selection means for selecting the respective channel by means of the channel signal to change the respective channel clock signal.

7. A method for providing clock signals in a multi-channel architecture comprising the steps of:
   generating a central master clock signal;
   receiving the central master clock signal by a channel of a plurality of channels within a multi-channel architecture; and
   generating a channel clock signal from the central master clock signal for application to the respective channel.

8. The method according to claim 7, further comprising a step of generating a reference signal from the central master clock signal for application to the respective channel.

* * * * *